(12) United States Patent
Choi et al.

(10) Patent No.: US 8,286,580 B2
(45) Date of Patent: Oct. 16, 2012

(54) APPARATUS AND METHOD FOR TREATING SUBSTRATE

(75) Inventors: Jong-Su Choi, Cheonan-shi (KR); Young-Kweon Choi, Cheonan-shi (KR)

(73) Assignee: Semes Co., Ltd., Chungcheongnam-Do (KR)

( * ) Notice: Subject to any disclaimer, the term of this patent is extended or adjusted under 35 U.S.C. 154(b) by 1239 days.

(21) Appl. No.: 11/992,586

(22) PCT Filed: Sep. 26, 2006

(86) PCT No.: PCT/KR2006/003818
§ 371 (c)(1),
(2), (4) Date: Mar. 26, 2008

(87) PCT Pub. No.: WO2007/035071
PCT Pub. Date: Mar. 29, 2007

(65) Prior Publication Data
US 2009/0136670 A1     May 28, 2009

(30) Foreign Application Priority Data

Sep. 26, 2005  (KR) .................. 10-2005-0089181

(51) Int. Cl.
*B05C 11/02*    (2006.01)
*B05C 11/00*    (2006.01)
*B05B 7/06*     (2006.01)

(52) U.S. Cl. .......... 118/667; 118/666; 118/52; 118/612; 118/313; 118/315

(58) Field of Classification Search .................. 118/666, 118/667, 52, 56, 612, 319, 320, 313–315; 134/153, 198, 902; 427/240; 396/604, 611, 396/627

See application file for complete search history.

(56) References Cited

U.S. PATENT DOCUMENTS

| | | | | |
|---|---|---|---|---|
| 6,165,552 A * | 12/2000 | Anai et al. | ..................... | 427/240 |
| 6,306,455 B1 * | 10/2001 | Takamori et al. | ................. | 427/8 |
| 6,565,928 B2 * | 5/2003 | Sakamoto et al. | ............ | 427/508 |
| 6,627,263 B2 * | 9/2003 | Kitano et al. | ................. | 427/346 |
| 6,869,640 B2 * | 3/2005 | Yoshihara et al. | ............ | 427/240 |
| 6,872,254 B2 * | 3/2005 | Shirley | ............................ | 118/52 |
| 2001/0047753 A1 * | 12/2001 | Nagamine et al. | ............ | 118/666 |

FOREIGN PATENT DOCUMENTS

| | | |
|---|---|---|
| JP | 04-115520 | 4/1992 |
| JP | 08-264412 | 10/1996 |
| JP | 2000-223394 | 8/2000 |
| JP | 2001-102297 | 4/2001 |
| JP | 2001-239202 | 9/2001 |
| JP | 2001-291660 | 10/2001 |
| JP | 2001-297788 | 10/2001 |
| JP | 2001-327909 | 11/2001 |
| JP | 2003-178946 | 6/2003 |

(Continued)

*Primary Examiner* — Yewebdar Tadesse
(74) *Attorney, Agent, or Firm* — Harness, Dickey & Pierce, P.L.C.

(57) ABSTRACT

The present invention provides a method that can maintain the temperature of a wafer at a process temperature before a coating process is performed by supplying a photoresist. According to the present invention, a thinner which helps a diffusion of the photoresist is supplied onto the wafer before the photoresist is supplied. The thinner is supplied in a temperature-controlled state such that the wafer has the process temperature by the thinner.

9 Claims, 7 Drawing Sheets

FOREIGN PATENT DOCUMENTS

| | | |
|---|---|---|
| JP | 2003/234286 | 8/2003 |
| JP | 2003-249476 | 9/2003 |
| JP | 2004-241414 | 8/2004 |
| JP | 2005-197321 | 7/2005 |
| KR | 10-2001-0107683 | 12/2001 |
| TW | 582050 | 4/2004 |
| TW | 1229019 | 3/2005 |

* cited by examiner

[Fig. 1]
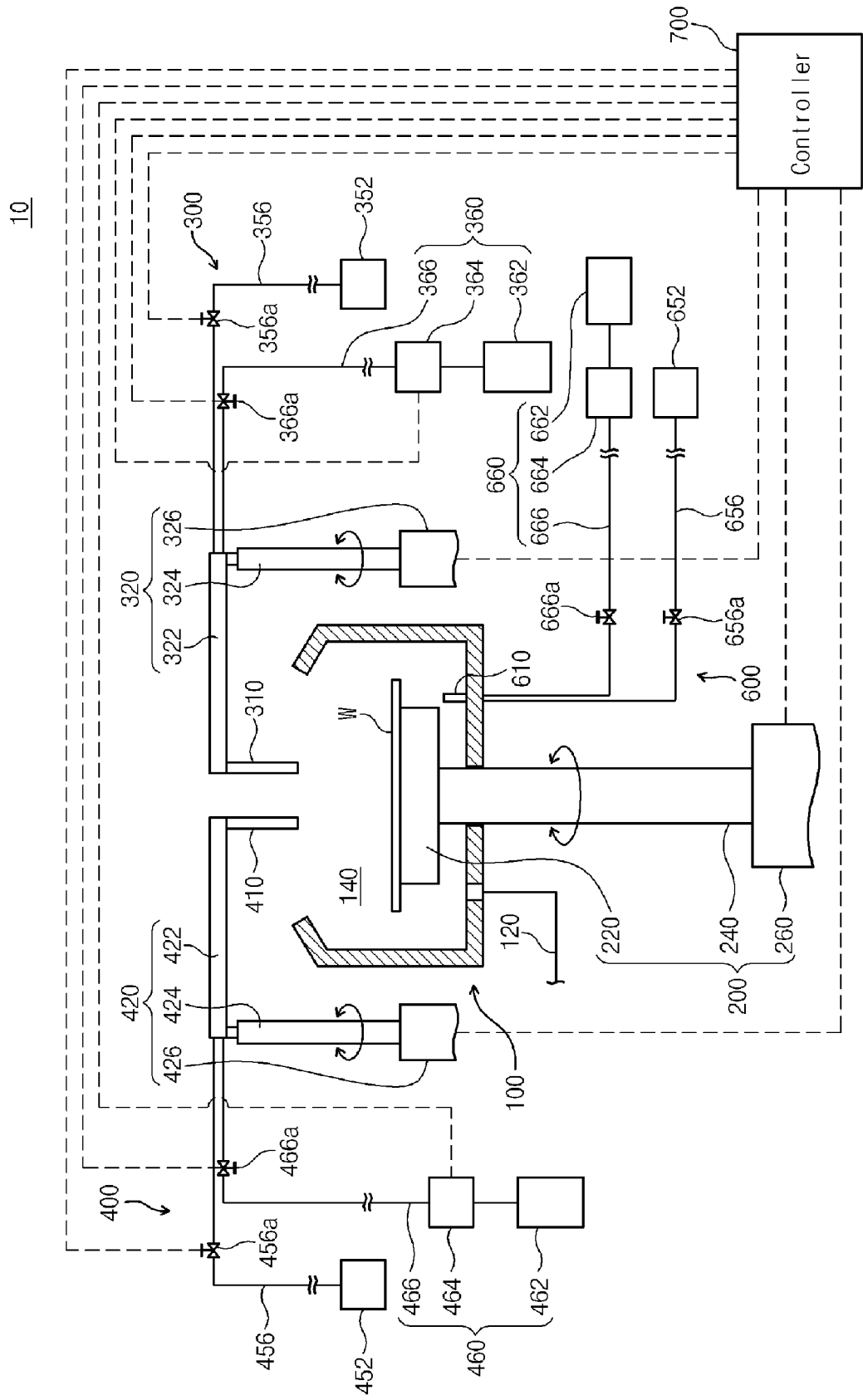

[Fig. 2]
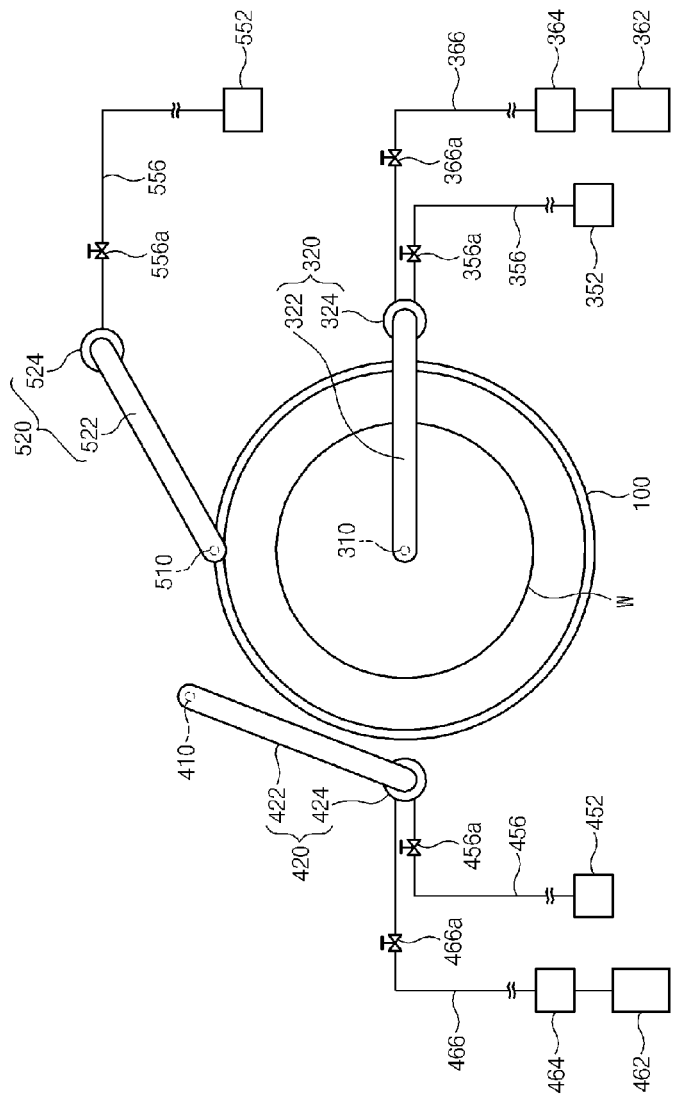
[Fig. 3]
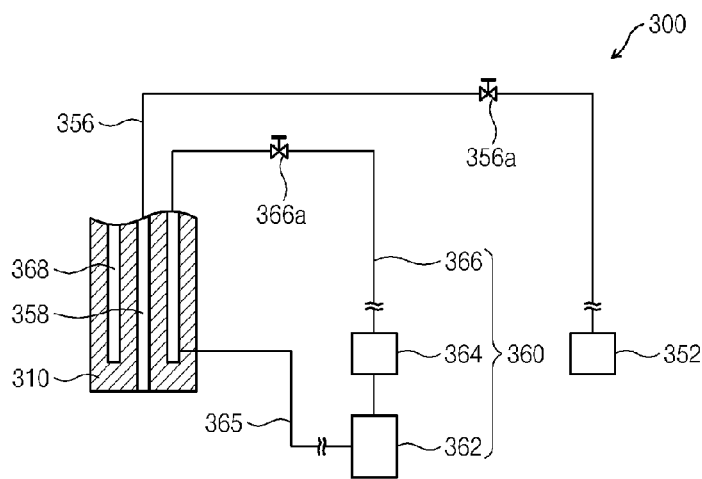

[Fig. 4]
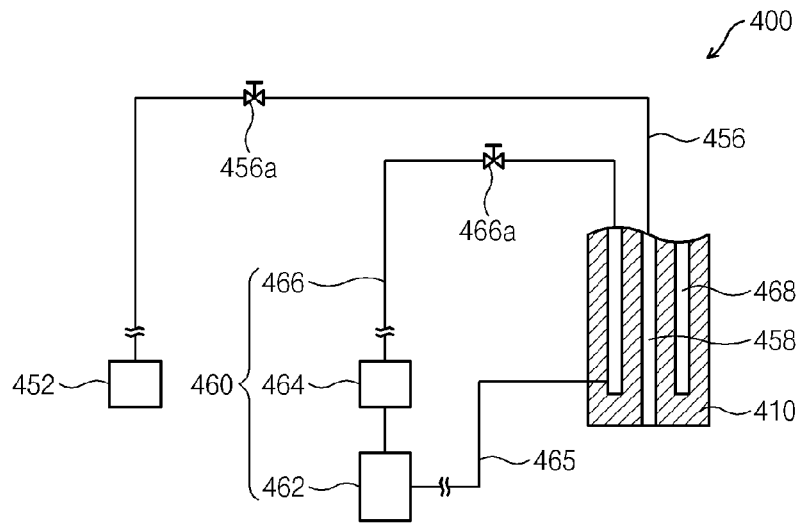
[Fig. 5]
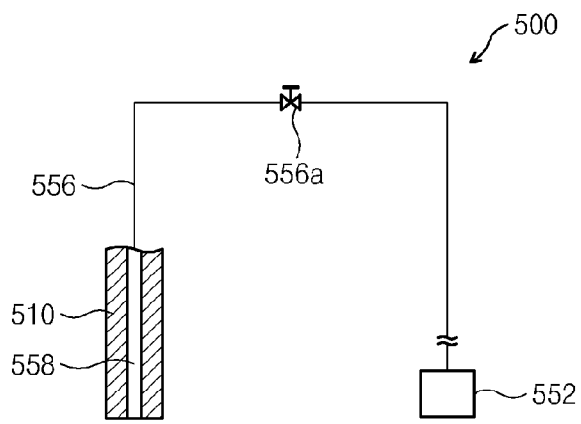
[Fig. 6]
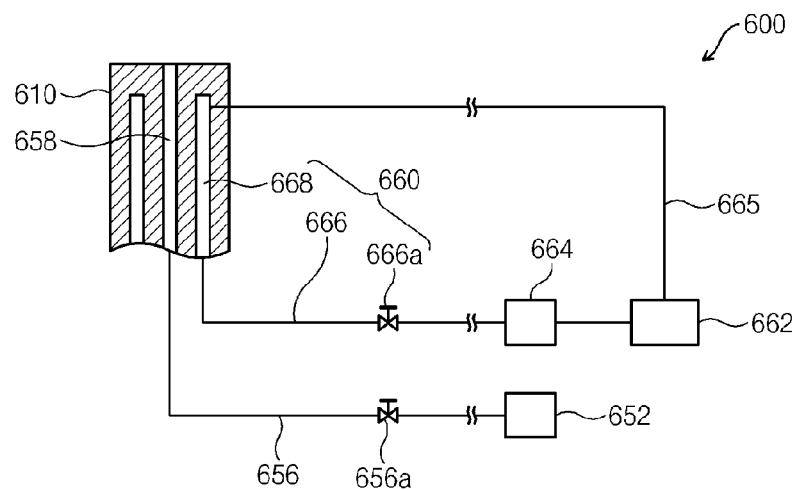

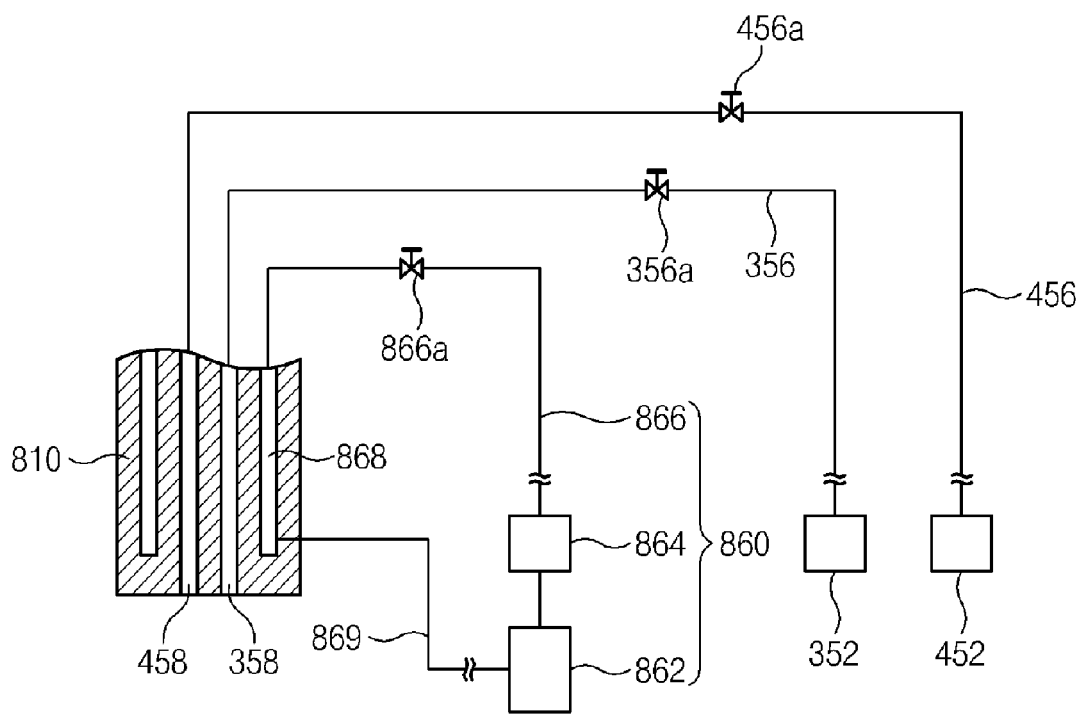
[Fig. 7]
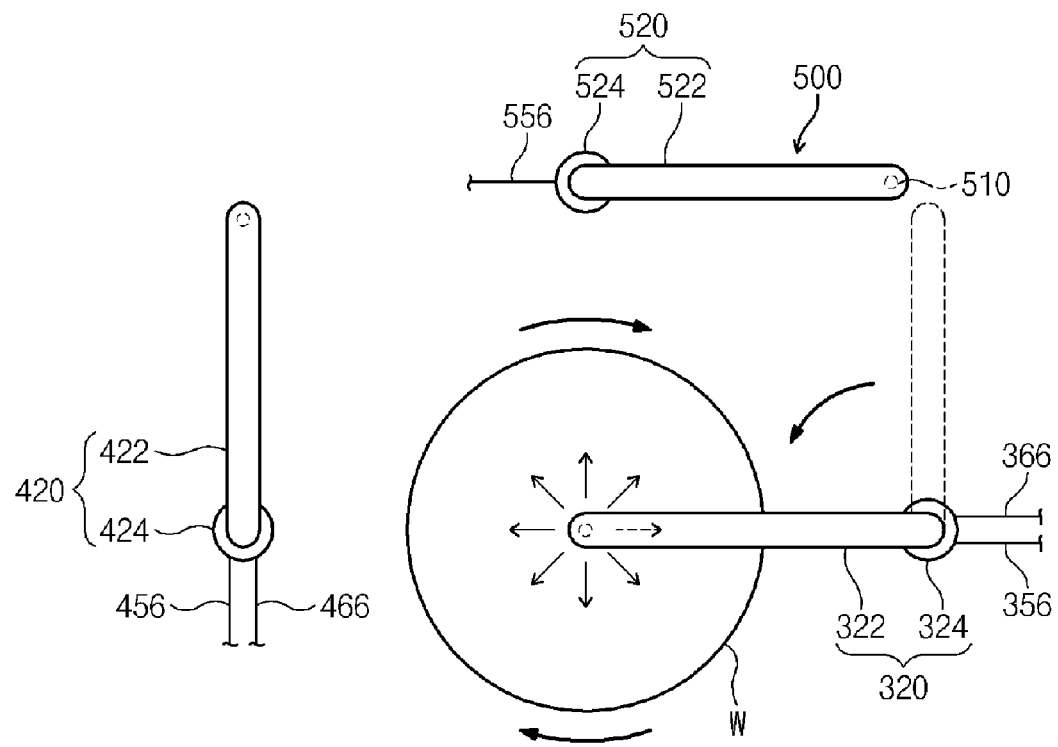
[Fig. 8]

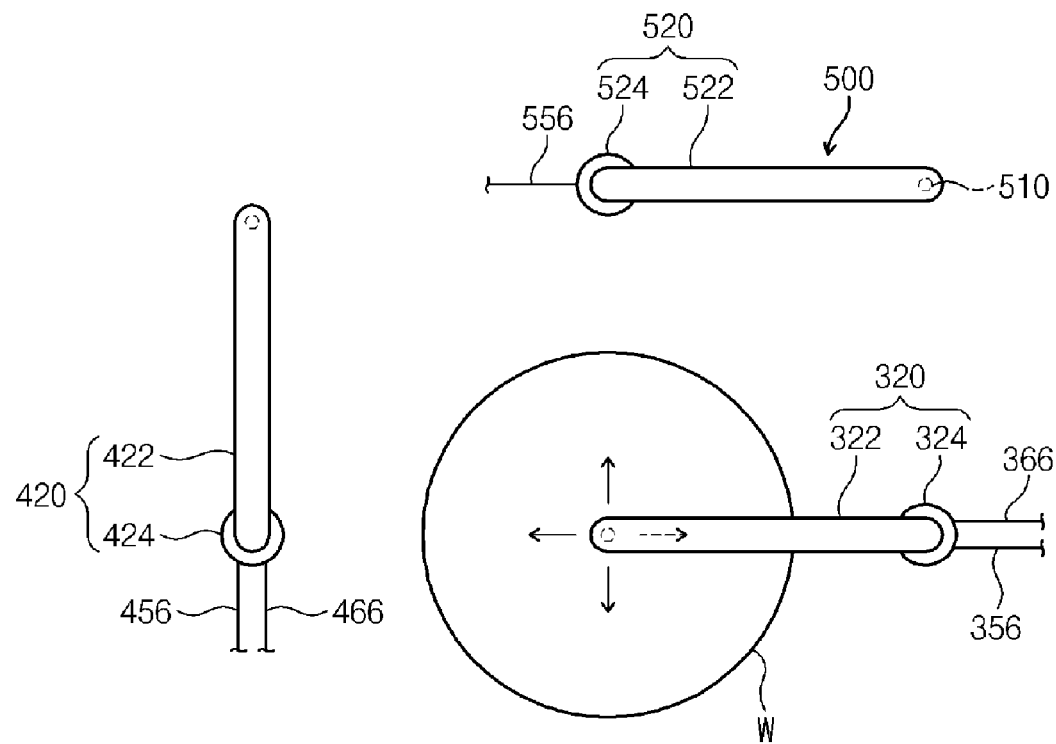
[Fig. 9]
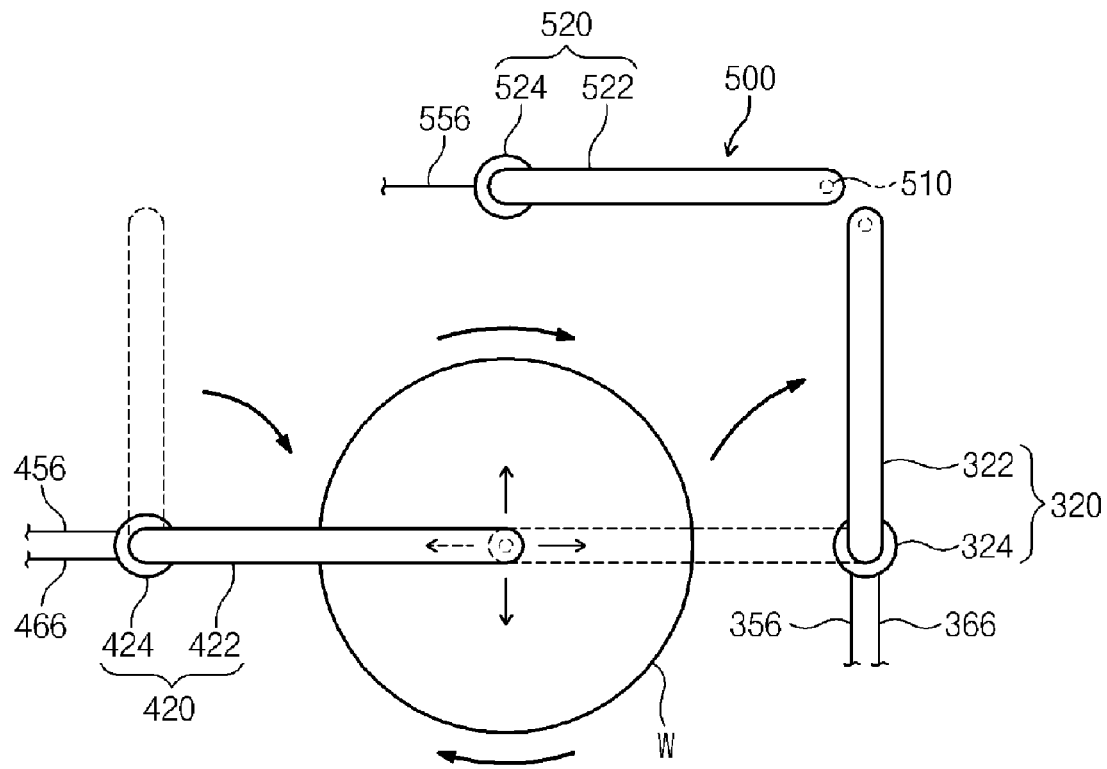
[Fig. 10]

[Fig. 11]
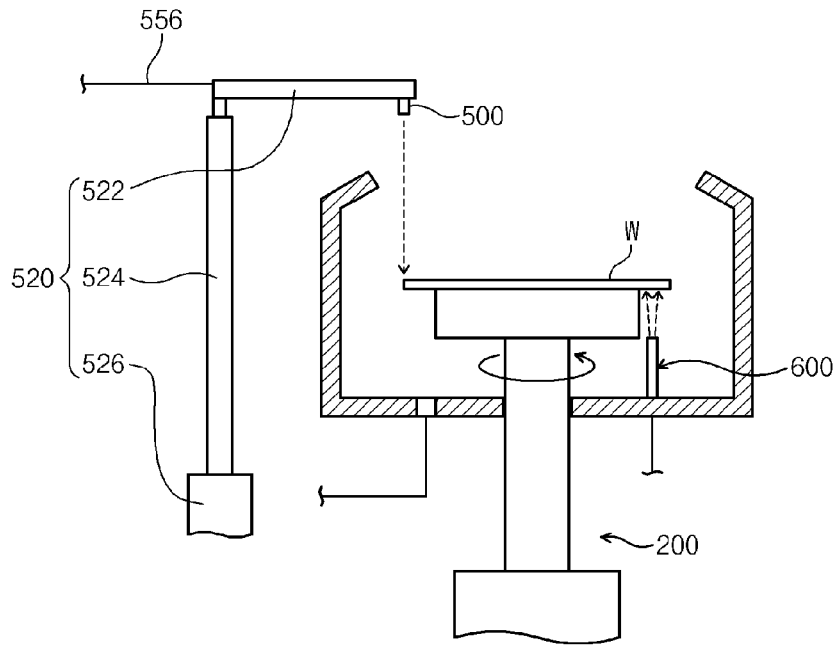
[Fig. 12]
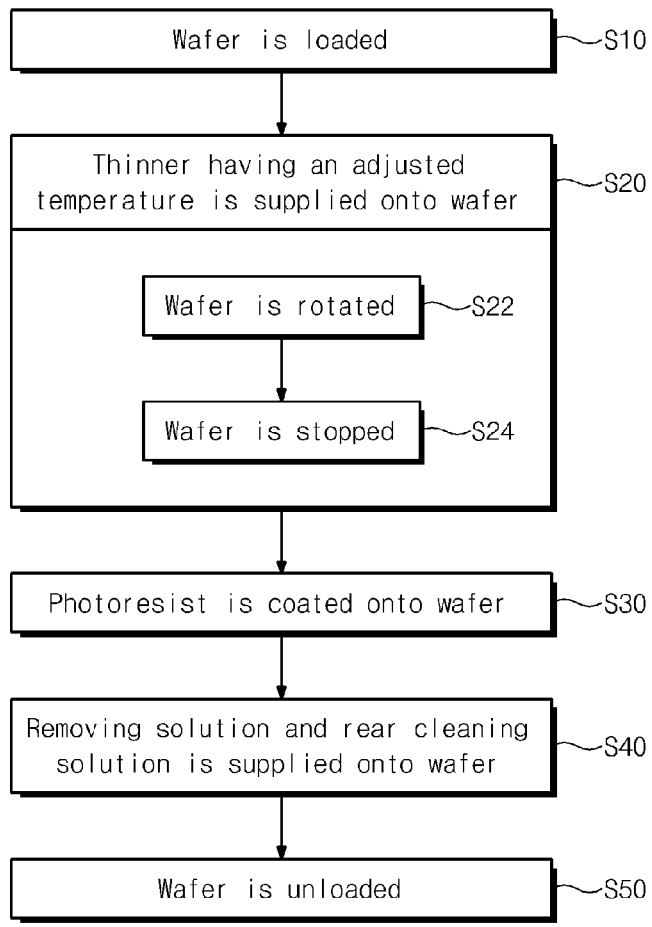

[Fig. 13]
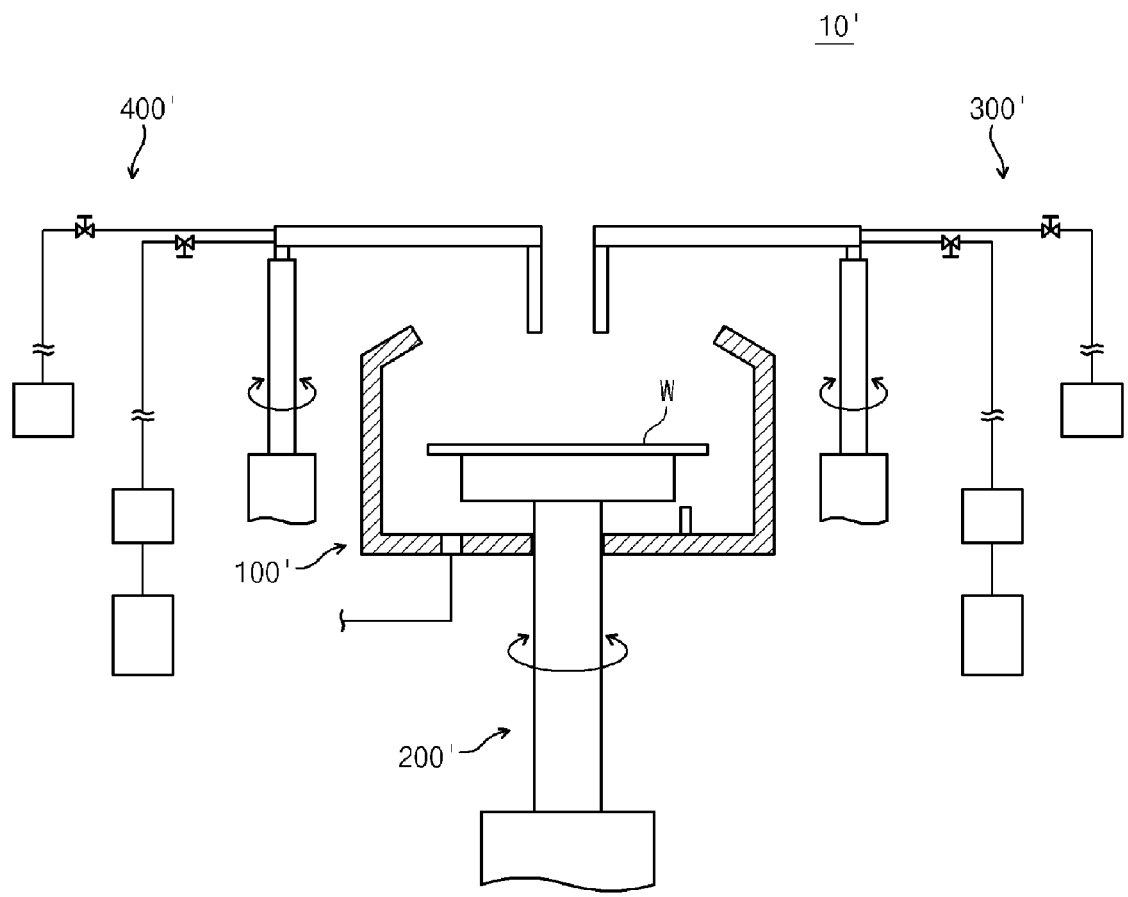
[Fig. 14]
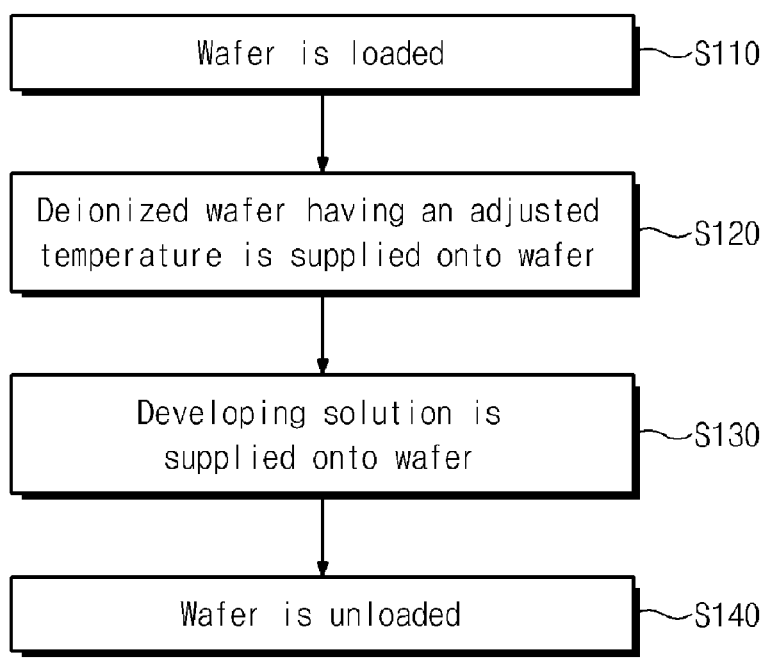

APPARATUS AND METHOD FOR TREATING SUBSTRATE

TECHNICAL FIELD

The present invention relates to apparatus and method for treating a substrate, and more particularly, to apparatus and method for treating a substrate, such as a semi-conductor substrate, by supplying a chemical onto the substrate.

BACKGROUND ART

For the fabrication of semiconductor devices, a wafer undergoes a variety of processes. Among these processes, a photolithography process is used to form a pattern on the wafer, and it includes a coating process of coating a photo-sensitive solution, such as a photoresist on the wafer, a photographing process of irradiating light onto the coated photoresist to form a provisional image for the pattern to be formed, and a developing process of developing the provisional image into the pattern. In the coating process, it is very important to coat the photoresist in a uniform thickness and at a set thickness, and the temperature of the wafer has a large influence on the thickness uniformity of the photoresist coated thereon.

Before the coating process is performed, the wafer is generally heated or cooled in a bake module, and then transferred by a robot to a module to perform the coating process. The temperature of the wafer is influenced by a contact with the robot. As such, in order to maintain the wafer at the process temperature, a temperature control member controlling the temperature of the wafer is provided in the robot.

In general, two or more bake modules are provided in up/down direction or left/right direction in a substrate treating apparatus. The contact time of wafers with the transfer robot is varied depending on the position of the bake modules in which processes are performed. Accordingly, it is not easy to control the temperature of the wafers equally and precisely. Also, since only a selected region of the wafer contacts the robot, the temperature of the wafer is different according to its regions.

The aforementioned drawback causes the photoresist to be coated in a coating process with a low uniformity between wafers or between regions in a single wafer.

DISCLOSURE OF INVENTION

Technical Problem

The present invention provides apparatus and method for treating a substrate that can allow the temperature of the substrate to be uniformly kept at a process temperature before a process is performed with respect to the substrate.

Also, the present invention provides apparatus and method for treating a substrate that can enhance the uniformity in the thickness of coated photoresist between wafers or between regions in a single wafer.

Technical Solution

The present invention provides an apparatus for treating a substrate by supplying a chemical solution onto the substrate to perform a process. The apparatus includes: a support member on which the substrate is mounted; a chemical solution supply member supplying the chemical solution onto the substrate mounted on the support member; and a fluid supply member supplying a fluid onto the substrate, the fluid controlling the temperature of the substrate at a preset process temperature before the chemical solution is supplied to the substrate, wherein the fluid supply member includes: a fluid supply line through which the fluid is supplied; and a temperature control member controlling the temperature of the fluid.

In one example of the present invention, the process is a process of coating a photo-sensitive solution on the substrate, the chemical solution is a photosensitive solution, the fluid is a treating solution which allows the photosensitive solution to be easily diffused on the substrate, the fluid supply member comprises a treating solution supply member supplying the treating solution onto the substrate, and the fluid supply line includes a treating solution supply line through which the treating solution is supplied.

The support member includes: a support plate on which the substrate is mounted; and a rotational shaft coupled to the support plate and rotatable by a driver. Alternatively, the apparatus may be further provided with a controller controlling whether or not the rotational shaft is rotated, whether to open or close a valve installed on the treating solution supply line, or an opened or closed degree of the valve.

In one example, the temperature control member controlling the temperature of the treating solution includes: a constant temperature fluid supply line disposed to enclose at least a portion of the treating solution supply line, through which a constant temperature fluid flows; and a temperature controller controlling the temperature of the constant temperature fluid.

In one example, the photosensitive solution supply member includes: a photo-sensitive solution supply line through which the photosensitive solution is supplied; and a temperature control member controlling the temperature of the photosensitive solution such that the photosensitive solution maintains a preset process temperature. The temperature control member controlling the photosensitive solution includes: a constant temperature fluid supply line disposed to enclose at least a portion of the photosensitive solution supply line, through which a constant temperature fluid flows; and a temperature controller controlling the temperature of the constant temperature fluid.

In one example, the photosensitive solution may be a photoresist, and the treating solution may be a thinner.

In another embodiment of the present invention, the process is a developing process, the chemical solution is a developing solution, and the fluid is deionized water.

The temperature control member controlling the fluid includes: a constant temperature fluid supply line disposed to enclose at least a portion of the fluid supply line, through which a constant temperature fluid flows; and a temperature controller controlling the temperature of the constant temperature fluid.

Also, the apparatus may further include a cleaning solution supply member cleaning a rear surface of the substrate. The cleaning solution supply member includes: a cleaning solution supply line supplying the cleaning solution onto the rear surface of the substrate; and a temperature control member controlling the temperature of the cleaning solution flowing through the cleaning solution supply line.

In one example, the temperature control member controlling the temperature of the cleaning solution includes: a constant temperature fluid supply line disposed to enclose at least a portion of the cleaning solution supply line, through which a constant temperature fluid flows; and a temperature controller controlling the temperature of the constant temperature fluid.

Further, the present invention provides a method for treating a substrate using a chemical solution.

According to the above method, a temperature-controlled fluid is supplied onto the substrate to maintain the substrate at a preset process temperature using the temperature-controlled fluid. The chemical solution is then supplied onto the substrate to perform a process.

In one embodiment, the process is a coating process, the fluid is a thinner, and the chemical solution is a photoresist. The temperature control of the temperature-controlled fluid is performed by allowing a constant temperature fluid of which temperature is controlled and which circulates, to flow through a region adjacent to a supply line through which the temperature-controlled fluid is supplied. The substrate can rotate while the temperature-controlled fluid is supplied.

In other embodiment, the process is a developing process, the temperature-controlled fluid is deionized water, and the chemical solution is a developing solution.

Furthermore, the present invention provides a method for treating a substrate. The method includes: loading the substrate on a support plate; supplying a treating solution onto the substrate, the treating solution allowing a photosensitive solution to be easily diffused on the substrate; supplying the photosensitive solution onto the substrate; and unloading the substrate from the support plate, wherein the supplying the treating solution onto the substrate comprises supplying the treating solution of which temperature is controlled, onto the substrate such that the substrate maintains a process temperature preset by the treating solution.

The supplying the treating solution of which temperature is controlled onto the substrate may include rotating the substrate while the treating solution is supplied onto the substrate. Also, the supplying the treating solution of which temperature is controlled onto the substrate may include stopping the substrate while the treating solution is supplied onto the substrate after the rotating the substrate while the treating solution is supplied onto the substrate.

In one example, the temperature control of the temperature-controlled fluid is performed by allowing a constant temperature fluid of which temperature is controlled and which circulates, to flow through a region adjacent to a supply line through which the temperature-controlled fluid is supplied.

The above method may, after the supplying the chemical solution onto the substrate, further include supplying a cleaning solution onto a rear surface of the substrate to clean the rear surface of the substrate. The cleaning solution is temperature-controlled and supplied onto the substrate such that the substrate maintains the preset process temperature by the cleaning solution. The temperature control of the cleaning solution supplied onto the rear surface of the substrate is performed by allowing a constant temperature fluid of which temperature is controlled and which circulates, to flow along an outer circumference of a cleaning solution supply line through which the cleaning solution is supplied.

The above method may, after the supplying the photosensitive solution onto the substrate, further include supplying a removing solution onto a bevel section of the substrate to remove the photosensitive solution adhered on the bevel section of the substrate. The supplying the cleaning solution onto the rear surface of the substrate to clean the rear surface of the substrate is performed simultaneously with the removing the photosensitive solution adhered on the bevel section of the substrate.

Also, the present invention provides a method for coating a photosensitive solution on a substrate. The method includes: loading the substrate on a support plate; supplying a treating solution onto the substrate, the treating solution allowing the photosensitive solution to be easily diffused on the substrate; supplying the photosensitive solution onto the substrate; and unloading the substrate from the support plate, wherein the supplying the treating solution onto the substrate comprises rotating the substrate while the treating solution is supplied onto the substrate.

ADVANTAGEOUS EFFECTS

According to the present invention, it is possible to maintain the wafer at a process temperature while a process, such as a coating process or the like, is performed.

Also, according to the present invention, it is possible to eliminate a temperature difference from region to region within an entire region of a wafer while a process, such as a coating process or the like, is performed.

In addition, according to the present invention, it is not necessary to essentially provide a separate device for the temperature control of a wafer since the temperature control of the wafer is performed by a thinner supplied to the wafer before a photoresist is coated.

BRIEF DESCRIPTION OF THE DRAWINGS

FIG. 1 is a view schematically showing a coating apparatus according to a preferred embodiment of the present invention;

FIG. 2 is a plane view of the coating apparatus of FIG. 1;

FIG. 3 is a view schematically showing the construction of a treating solution supply member of FIG. 1;

FIG. 4 is a view schematically showing the construction of a chemical solution supply member of FIG. 1;

FIG. 5 is a view schematically showing the construction of a removing solution supply member of FIG. 1;

FIG. 6 is a view schematically showing the construction of a cleaning solution supply member of FIG. 1;

FIG. 7 is a view schematically showing a member for supplying a treating solution and a chemical solution according to another embodiment of the present invention;

FIGS. 8 through 11 are schematic views sequentially showing steps for performing a coating process on a wafer;

FIG. 12 is a flowchart sequentially showing steps of a coating process according to the present invention;

FIG. 13 is a schematic view of a developing apparatus according to a preferred embodiment of the present invention; and FIG. 14 is a flowchart sequentially showing steps of a developing process according to the present invention.

DESCRIPTION OF SYMBOLS IN MAIN PORTIONS OF THE DRAWINGS

100: Container 200: Supporting member
300: Treating solution supply member
400: Chemical solution supply member
500: Removing solution supply member
600: Cleaning solution supply member
700: Controller

BEST MODE FOR CARRYING OUT THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity.

FIG. 1 is a view schematically showing an embodiment of a substrate treating apparatus 10 according to the present invention, and FIG. 2 is a plane view of FIG. 1. The present embodiment exemplarily illustrates an apparatus for coating a photoresist on a wafer W as one example of the substrate treating apparatus 10.

Referring to FIGS. 1 and 2, the coating apparatus according to the present invention has a container 100, a support member 200, a treating solution supply member 300, a chemical solution supply member 400, a removing solution supply member 500, a cleaning solution member 600, and a controller 700. The container 100 provides a space in which a coating process is performed. The treating solution supply member 300 supplies a treating solution for helping a diffusion of photoresist on the wafer W before the photoresist is supplied. The treating solution allows the supply amount of the photoresist used in the coating process to be decreased. As the treating solution, thinner can be used. The chemical solution supply member 400 supplies a photo-sensitive solution, such as photoresist, onto the wafer W. The removing solution supply member 500 supplies a bevel section of the wafer W with a removing solution for removing the photoresist adhered on the bevel section of the wafer W after the photoresist has been coated. The thinner can be used as a removing solution for preventing the photoresist adhered on the bevel section of the wafer W from acting as a particle later. The cleaning solution supply member 600 supplies a rear surface of the wafer W with a cleaning solution for removing contaminants attached on the rear surface of the wafer W after the photoresist has been coated. The contaminants may be particles, photoresist or the like, and the thinner can be used as the cleaning solution. The controller 700 controls rotation of the wafer W, movement of nozzles 310, 410, 510 to be described later, opening/closing of valves 356a, 366a, 456a, 466a, 556a, 656a, 666a to be described later, and operations of temperature controllers 362, 462, 662 to be described later.

While the aforementioned example describes that the thinner can be used for all the treating solution, the removing solution and the cleaning solution, fluid other than the thinner may be used for these respective solutions.

Again referring to FIG. 1, the container 100 is shaped in a bowl of which inside has a space 140 having an opened upper portion, and a drainage line 120 through which fluid used in a process is drained is coupled to a lower side of the container 100.

The support member 200 supports the wafer W while a process is performed. The support member 200 is shaped in a cylinder, and has a support plate 220 on which the wafer W is mounted, and a rotational shaft 240 extending downward from a bottom surface thereof and rotatable by a motor 260. The support plate 220 is disposed within the container 100, and the rotational shaft 220 is installed to penetrate a bottom surface of the container 100. The support plate 220 can support the wafer W using a mechanical method, such as a clamp, or by a vacuum adsorption method. The support plate 200 can have a diameter ranging from about one half to two thirds of the diameter of the wafer W. The support plate 220 may be provided with a heating member or a cooling member (not shown) for controlling the temperature of the wafer W to a desired one.

The treating solution supply member 300 supplies a treating solution to a central portion of the wafer W before the photoresist is supplied such that the photoresist to be supplied later is easily diffused and the wafer W is kept at a process temperature.

Referring to FIG. 3, the treating solution supply member 300 has a nozzle 310, a nozzle moving member (see 320 of FIG. 1), a supply pipe 356, a treating solution supply line 358, and a temperature control member 360. The nozzle 310 is moved in up/down direction by the nozzle moving member 320 or is rotatably moved from a central upper portion of the wafer W to an outside of the container 100. The nozzle moving member 320 has a horizontal support bar 322 to which the nozzle is coupled, and a vertical support bar 324 coupled to one end of the horizontal support bar 322 and rotatable by a motor 326. Unlike this, the nozzle moving member 320 may have a configuration to move the nozzle 310 from the central upper portion of the wafer W to an outside of the container 100 in a straight line path. The supply pipe 356 connects a treating solution storage section 352 and the nozzle 310, and is made of a flexible material. A valve or a flow control valve 356a is installed on the supply pipe 356. The treating solution supply line 358 is a passage for supplying a treating solution, and is formed within the supply pipe 356, the horizontal support bar 322 and the nozzle 310.

According to the present invention, the treating solution is controlled at an appropriate process temperature by the temperature control member 360 and then supplied onto the wafer W. The temperature control member 360 allows the wafer W to be kept at the process temperature before the photoresist is supplied. The treating solution is supplied onto the wafer W under the condition that the temperature of the treating solution is controlled to a temperature appropriate for maintaining the wafer W at the process temperature. The wafer W is maintained at a preset process temperature through a heat exchange with the treating solution. Herein, the preset process temperature may be a specific value or a specific range.

According to one example, the temperature control member 360 has a constant temperature fluid supply line 368 provided for enclosing at least some of the treating solution supply line 358, and a temperature controller 364 for controlling the temperature of a constant temperature fluid. Liquid, for example, deionized water or the like, or inert gas, for example, nitrogen, can be used for the constant temperature fluid. It is desirable that the treating solution be maintained at the preset process temperature before being dispensed from the treating solution supply line 358. Accordingly, the constant temperature fluid supply line 368 is provided to enclose the treating solution supply line 358 disposed in the nozzle 310, and can extend to the supply pipe 366 connecting the nozzle 310 and the constant temperature fluid storage section 362. A temperature controller 364 for controlling the temperature of the constant temperature fluid is installed on the supply pipe. A withdrawal pipe 365 for withdrawing the constant temperature fluid used for controlling the temperature of the treating solution to the temperature controller 364 or the constant temperature fluid storage section 362 is connected to one end of the nozzle 310.

The chemical solution supply member 400 supplies photoresist to a central portion of the wafer W and coats the photoresist on the wafer W. Referring to FIG. 4, the chemical solution supply member 400 has a nozzle 410, a nozzle moving member (see 420 of FIG. 1), a supply pipe 456, a photoresist supply line 458, and a temperature control member 460. The nozzle 410 is linearly moved in up/down direction by the nozzle moving member 420, or is rotatably moved from a central upper portion of the wafer W to an outside of the container 100. The nozzle moving member 420 has a horizontal support bar 422 to which the nozzle 410 is coupled, and a vertical support bar 424 coupled to one end of the horizontal support bar 422 and rotatable by a motor 426. Unlike this, the nozzle moving member 420 may have a configuration to move the nozzle 410 from the central upper portion of the wafer W to an outside of the container 100 in a radial direction of the wafer W. The supply pipe 456 connects a chemical solution storage section 452 and the nozzle 410, and is made of a flexible material. A valve or a flow control valve 456a is installed on the supply pipe 456. A photosensitive solution supply line 458 is disposed within the nozzle 410, the horizontal support bar 422 and the supply line 456.

The photoresist is controlled at an appropriate temperature by the temperature control member 460 and then supplied onto the wafer W. The temperature control member 460 has a constant temperature fluid supply line 468 provided for enclosing at least some of the photosensitive solution supply line 458, and a temperature controller 464 for controlling the temperature of a constant temperature fluid. Deionized water or nitrogen can be used for the constant temperature fluid. It is desirable that the photo-sensitive solution be maintained at the preset process temperature before being dispensed from the photoresist solution supply line 458. Accordingly, the constant temperature fluid supply line 468 is provided to enclose the photosensitive solution supply line 458 disposed in the nozzle 410, and can extend to the supply pipe 466 connecting the nozzle 410 and the constant temperature fluid storage section 462. A temperature controller 464 for controlling the temperature of the constant temperature fluid is installed on the supply pipe 466. A withdrawal pipe 465 for withdrawing the constant temperature fluid used for controlling the temperature of the photosensitive solution to the temperature controller 464 or the constant temperature fluid storage section 462 is connected to one end of the nozzle 410.

As aforementioned, the removing solution supply member 500 supplies a bevel section of the wafer W with a removing solution to remove the photoresist adhered on the bevel section of the wafer W. Referring to FIG. 5, the removing solution supply member 500 has a nozzle 510, a nozzle moving member 520 (see 520 of FIG. 2), a supply pipe 556, and a removing solution supply line 558. The nozzle 510 is linearly moved in up/down direction by the nozzle moving member 520, or is rotatably moved from an upper portion of the bevel section of the wafer W to a side portion of the container 100. The nozzle moving member 520 has a horizontal support bar 522 to which the nozzle 510 is coupled, and a vertical support bar 524 coupled to one end of the horizontal support bar 522 and rotatable by a motor (see 526 of FIG. 11). Unlike this, the nozzle moving member 520 may have a configuration to move the nozzle 510 from the upper portion of the bevel section of the wafer W to an outside of the container 100 in a radial direction of the wafer W. The supply pipe 556 connects a removing solution storage section 552 and the nozzle 510, and is made of a flexible material. A valve or a flow control valve 556a is installed on the supply pipe 556. A removing solution supply line 558 is disposed within the nozzle 510, the horizontal support bar 522 and the supply line 556.

The cleaning solution supply member 600 supplies a cleaning solution onto the rear surface of the wafer W so as to clean the rear surface of the wafer W. Referring to FIG. 6, the cleaning solution supply member 600 has a nozzle 610, a supply pipe 656, a cleaning solution supply line 658, and a temperature control member 660. The cleaning solution supply line 658 is provided within the nozzle 610 and the supply line 656. The nozzle 610 is installed within the container 100 to be directed toward the rear surface of the wafer. In case where the wafer W is vacuum-adsorbed on the support plate 220, the nozzle 610 is installed such that the cleaning solution is sprayed toward the rear surface of the wafer W adjacent to the support plate 220. The supply pipe 656 connects a cleaning solution storage section 652 and the nozzle 610, and is made of a flexible material. A valve or a flow control valve 656a is installed on the supply pipe 656. In case where the wafer W is supported on the support plate 220 spaced apart from the support plate 220, the cleaning solution supply line 658 can be provided within the rotational shaft 240.

According to the present invention, the cleaning solution is controlled at an appropriate temperature by the temperature control member 660 and then supplied onto the wafer W. After the photoresist is supplied onto the wafer W, a time for stabilizing the photoresist coated on the wafer W is required. If the temperature of the wafer W is higher than a set temperature, the photoresist is not sufficiently spread to an entire region of the wafer W. The temperature control member 660 controls the temperature of the cleaning solution such that the wafer W can be kept at the process temperature before the photoresist is coated and stabilized on the wafer W.

According to one example, the temperature control member 660 has a constant temperature fluid supply line 668 provided for enclosing at least some of the cleaning solution supply line 658, and a temperature controller 664 for controlling the temperature of a constant temperature fluid. Liquid or gas can be provided as the constant temperature fluid. It is desirable that the cleaning solution be maintained at the set temperature before being dispensed from the cleaning solution supply line 658.

Accordingly, the constant temperature fluid supply line 668 is provided to enclose the cleaning solution supply line 658 disposed in the nozzle 610, and can extend to the supply pipe 666 connecting the nozzle 610 and the constant temperature fluid storage section 662. A temperature controller 664 for controlling the temperature of the constant temperature fluid is installed on the supply pipe 666. A withdrawal pipe 665 for withdrawing the constant temperature fluid used for controlling the temperature of the cleaning solution to the temperature controller 664 or the constant temperature fluid storage section 662 is connected to one end of the nozzle 610.

The process temperature of the photoresist may be the same as that of the wafer W according to the processes. This includes a case where the set process temperature range of the photoresist partially overlaps the process temperature range of the wafer W. At this time, as shown in FIG. 7, the photosensitive solution supply line 458 and the treating solution supply line 358 are provided in parallel within one nozzle 810, and the temperatures of the photosensitive solution and the treating solution are controlled by a single temperature control member 860. The temperature control member 860 has a constant temperature fluid supply line 868 provided for enclosing the treating solution supply line 358 and the photosensitive solution supply line 458 within the nozzle 810, and the constant temperature fluid supply line 868 is formed extending to an inside of the supply pipe 866 connecting the constant temperature fluid storage section 862 and the nozzle 861. A temperature controller 864 for controlling the temperature of the constant temperature fluid is installed within the supply pipe 866. A withdrawal line 869 is connected to one end of the nozzle 810 so as to withdraw the constant temperature fluid heat-exchanged with the treating solution and the photo-sensitive solution to the temperature controller 864 or the constant temperature fluid storage section 862.

The above examples describe that the constant temperature fluid supply lines 368, 468, 668 are respectively configured to enclose the treating solution supply line 358, the photosensitive solution supply line 458, and the cleaning solution supply line 658 within the nozzle. However, such examples are only one preferred example such that the constant temperature fluid supply lines 368, 468, 668 are respectively arranged adjacent to the treating solution supply line 358, the photosensitive solution supply line 458, and the cleaning solution supply line 658. So, the constant temperature fluid supply lines 368, 468, 668, the treating solution supply line 358, the photosensitive solution supply line 458, and the cleaning solution supply line 658 may be arranged different from in the aforementioned embodiment if heat can be exchanged between the constant temperature fluid, the photosensitive solution, the treating solution, and the cleaning solution.

Next, a method for treating a substrate using a substrate treating apparatus having the aforementioned construction will be described with reference to FIGS. 8 through 12.

In an initial stage, the nozzle 310 of the treating solution supply member 300, the nozzle 410 of the photosensitive solution supply member 400, and the nozzle 510 of the removing solution supply member 500 are located outside the container 100. If the wafer W is mounted on the support plate 220 by a transfer robot (not shown), the wafer W is fixed on the support plate 220 by a vacuum (Step S10). The nozzle 310 of the treating solution supply member 300 is moved to a central upper portion of the wafer W, and then a treating solution is supplied onto the wafer W (see FIGS. 8 and 9). Thinner is supplied to the treating solution supply line 358, and a constant temperature fluid having an adjusted temperature is fed to the constant temperature fluid supply line 368 (Step S20). The thinner is supplied to a center of the wafer W from the treating solution supply line 358, and the constant temperature fluid is heat-exchanged with the thinner and is withdrawn to the treating solution storage section 362 through the withdrawal line 365. The thinner is maintained at a temperature that can maintain the wafer at the process temperature through heat exchange with the constant temperature fluid. The thinner supplied to the wafer W allows the photoresist to be smoothly diffused on the wafer W, later. As such, it is possible to save the use amount of the photoresist used in the coating process. Also, since the temperature-controlled thinner is supplied to the wafer W, the wafer W can be maintained at the process temperature and the temperature of the wafer W can be uniformly maintained throughout an entire region of the wafer W.

According to one example, while the thinner is supplied, the wafer W rotates (step S22, FIG. 8). The rotation of the wafer W allows the thinner to be rapidly diffused to an entire surface of the wafer, thus shortening the process time. While the thinner is supplied, it is preferable that the wafer should rotate at a high speed. For example, the revolutions per minute (RPM) of the wafer W can be about 2,000 to 3,000 RPM. If the thinner is sufficiently diffused to the entire surface of the wafer W, the rotation of the wafer W stops and the thinner is supplied to a middle region of the wafer W (Step S24, FIG. 9). This allows the thinner to be diffused in the form of a circle at the middle region of the wafer W. Alternatively, an operation of rotating the wafer W without supplying the thinner may be added between the operation of supplying the thinner while the wafer W rotates, and the operation of supplying the thinner in a state that the wafer stops. Also, an operation of rotating the wafer W without supplying the thinner may be added after the wafer stops and the thinner is supplied.

After the supply of the treating solution is completed, the nozzle 310 of the treating solution supply member 300 is moved to an outer region of the container 100, and the nozzle 410 of the photosensitive solution supply member 400 is moved from the outer region of the container 100 to the middle region of the wafer W. An operation of supplying photoresist onto the wafer W is performed (Step S30, FIG. 10). The photoresist is supplied to the photosensitive solution supply line 458 and the temperature-controlled constant temperature fluid is supplied to the constant temperature fluid supply line 468. The photoresist is supplied to the middle region of the wafer W through the photosensitive solution supply line 458, and the constant temperature fluid is heat-exchanged with the photoresist and is then withdrawn to the treating solution storage section 462 through the withdrawal line 465. The photoresist is maintained at the process temperature through heat exchange with the constant temperature fluid. While the photoresist is supplied to the wafer W, the wafer W rotates. After the supply of the photoresist is completed, the nozzle 410 of the photo-sensitive solution supply member 400 is moved to the outer region of the container 100.

After the photoresist is coated on the wafer W, the photoresist coated on the wafer W is stabilized, the photoresist adhered on the bevel section of the wafer W is removed, and the rear surface of the wafer W is cleaned (Step S40, FIG. 11). To stabilize the photoresist on the wafer W, the wafer W rotates at a constant speed. Together with this, a process of cleaning particles or photoresist adhered on the rear surface of the wafer W is performed. The thinner (cleaning solution) is supplied to the cleaning solution supply line 658, and the constant temperature fluid is supplied to the constant temperature fluid supply line 668. The thinner is supplied to a middle portion of the rear surface of the wafer W or a region adjacent to the support plate 220, and then diffused to an edge of the wafer W by a centrifugal force. After the constant temperature fluid is supplied through the constant temperature fluid supply line 668, the constant temperature fluid is heat-exchanged with the thinner and is then withdrawn to the treating solution storage section 662 through the withdrawal line 665. After the temperature of the thinner is adjusted to a temperature that can maintain the wafer at the process temperature through a heat exchange between the thinner and the constant temperature fluid, the thinner is supplied to the wafer W.

Also, the nozzle 510 of the removing solution supply member 500 is moved from the outer region of the container 100 to an upper portion of the bevel section of the wafer W. The removing solution (i.e., thinner) is supplied to the removing solution supply line 585 and then sprayed onto the bevel section of the wafer W. The process of removing the photoresist adhered on the bevel section of the wafer W is performed simultaneously with the process of cleaning the rear surface of the wafer W. Unlike the aforementioned method, the process of removing the photoresist adhered on the bevel section of the wafer W and the process of cleaning the rear surface of the wafer W may be sequentially performed. Thereafter, the wafer W is unloaded from the support plate 220 (Step S50).

In the above-described example, the apparatus of coating the photoresist on the wafer W is exemplarily illustrated. However, it will be apparent that the technical spirit of the present invention can be applied to an apparatus which performs a different kind of process needing to maintain the temperature of the substrate at the process temperature while the process is performed. Next, other exemplary process to which the technical spirit of the present invention can be applied will be described with a developing apparatus.

FIG. 13 is a view schematically showing one example of a developing apparatus 10'. Referring to FIG. 13, the developing apparatus 10' has a container 100', a support member 200', a treating solution supply member 300', and a chemical solution supply member 400'. Since the container 100', the support member 200', the treating solution supply member 300', and the chemical solution supply member 400' of the developing apparatus 10' can have the same construction as the container 100, the support member 200, the treating solution supply member 300 and the chemical solution supply member 400 of the coating apparatus 10, their detailed description will be omitted. Only it is noted that developing solution instead of the photosensitive solution can be used as the chemical solution and deionized water instead of the thinner can be used as the treating solution.

FIG. 14 is a flowchart sequentially showing steps of performing a developing process using the apparatus of FIG. 13. First, the wafer W is loaded on the support member 100 (Step S110). Treating solution is supplied onto the wafer W and the wafer W is maintained at a process temperature (Step S120). As aforementioned, deionized water can be used as the treating solution. The temperature of the treating solution is controlled by a temperature control member. For example, the temperature of the deionized water can be controlled by exchanging heat with a circulating constant temperature fluid. Thereafter, developing solution is supplied onto the wafer W (Step S130). After the developing step is completed, the wafer W is unloaded from the support member.

Industrial Applicability

The present invention can be usefully used in apparatus and process of treating chemical solution on a substrate by supplying the chemical solution onto the substrate.

The invention claimed is:

1. An apparatus for treating a substrate by supplying a chemical solution onto the substrate to perform a process, the apparatus comprising:
    a support member on which the substrate is mounted;
    a chemical solution supply member supplying the chemical solution onto the substrate mounted on the support member; and
    a fluid supply member supplying a fluid onto the substrate, the fluid controlling a temperature of the substrate at a preset process temperature before the chemical solution is supplied to the substrate,
    wherein the fluid supply member includes:
        a fluid supply line through which the fluid is supplied, and
        a first temperature control member controlling a temperature of the fluid, the first temperature control member including a first temperature control fluid supply line enclosing at least a portion of the fluid supply line, through which a first temperature control fluid flows, and a first temperature controller controlling a temperature of the first temperature control fluid, and
    wherein the process is a process of coating a photosensitive solution on the substrate, the chemical solution is the photosensitive solution, the fluid is a treating solution which allows the photosensitive solution to be easily diffused on the substrate, the fluid supply member includes a treating solution supply member supplying the treating solution onto the substrate, and the fluid supply line includes a treating solution supply line through which the treating solution is supplied; and
    a cleaning solution supply member cleaning a rear surface of the substrate,
    wherein the cleaning solution supply member includes:
        a cleaning solution supply line supplying a cleaning solution onto the rear surface of the substrate, and
        a second temperature control member controlling temperature of the cleaning solution flowing through the cleaning solution supply line, the second temperature control member including a second temperature control fluid supply line enclosing at least a portion of the cleaning solution supply line, through which a second temperature control fluid flows and a second temperature controller controlling temperature of the second temperature control fluid.

2. The apparatus of claim 1, wherein the support member comprises:
    a support plate on which the substrate is mounted; and
    a rotational shaft coupled to the support plate and rotatable by a driver, and the apparatus further comprises a controller controlling whether or not the rotational shaft is rotated and whether to open or close a valve installed on the treating solution supply line or an opened or closed degree of the valve.

3. The apparatus of claim 1, wherein a photosensitive solution supply member supplying the photosensitive solution comprises: a photosensitive solution supply line through which the photosensitive solution is supplied; and a third temperature control member controlling the temperature of the photosensitive solution such that the photosensitive solution maintains a preset process temperature,
    the third temperature control member including a third temperature control fluid supply line enclosing at least a portion of the photosensitive solution supply line, through which a third control fluid flows; and a third temperature controller controlling a temperature of the third temperature control fluid.

4. The apparatus of claim 1, wherein the photosensitive solution is a photoresist, and the treating solution is a thinner.

5. The apparatus of claim 1, wherein the process is a developing process, the chemical solution is a developing solution, and the fluid is deionized water.

6. The apparatus of claim 1, further comprising:
    a removing solution supply member supplying a removing solution onto a bevel section of the substrate so as to remove the photosensitive solution adhered on the bevel section of the substrate after a coating of the photosensitive solution is completed.

7. The apparatus of claim 1, wherein a chemical solution supply line included in the chemical solution supply member and the fluid supply line are in parallel within a nozzle and the first temperature control fluid supply line encloses at least a portion of at least one of the chemical solution supply line and the fluid supply line within the nozzle.

8. The apparatus of claim 1, wherein at least one of the first and second temperature control fluid supply lines is within a nozzle.

9. The apparatus of claim 1, wherein at least one of the first and second temperature control fluid supply lines extends to a supply pipe connecting a nozzle and to a temperature control fluid storage.

* * * * *